(12) United States Patent
Joo et al.

(10) Patent No.: US 6,345,011 B2
(45) Date of Patent: Feb. 5, 2002

(54) INPUT/OUTPUT LINE STRUCTURE OF A SEMICONDUCTOR MEMORY DEVICE

(75) Inventors: Jae-Hoon Joo; Sang-Seok Kang; Jong-Hyun Choi; Yun-Sang Lee, all of Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/758,526

(22) Filed: Jan. 10, 2001

(30) Foreign Application Priority Data

Jan. 10, 2000 (KR) .......................... 2000-00940

(51) Int. Cl.[7] ................................. G11C 8/00
(52) U.S. Cl. ................. 365/230.03; 365/63; 365/51
(58) Field of Search ..................... 365/230.03, 63, 365/51, 52

(56) References Cited

U.S. PATENT DOCUMENTS 5,973,953 A * 10/1999 Yamashita et al. ............ 365/63
6,052,323 A * 4/2000 Kawamura .................. 365/205
6,091,620 A * 7/2000 Kablanian .......... 365/230.03 X

* cited by examiner

*Primary Examiner*—Huan Hoang
(74) *Attorney, Agent, or Firm*—Marger Johnson & McCollom, P.C.

(57) ABSTRACT

A semiconductor memory device including a plurality of memory blocks having associated with one or more circuit blocks therearound, and a plurality of input/output lines associated with the memory blocks, is disclosed. The input/output lines are divided into at least a first group and a second group. First portions of the input/output lines of the first group are arranged between the adjacent memory blocks while first portions of the input/output lines of the second group are arranged within the circuit blocks around the adjacent memory blocks. Second portions of the input/output lines of the first group are arranged on the circuits blocks around the memory blocks while second portions of the input/output lines of the second group are arranged between the adjacent memory blocks.

3 Claims, 8 Drawing Sheets

INPUT/OUTPUT LINE STRUCTURE OF A SEMICONDUCTOR MEMORY DEVICE

This application relies for priority upon Korean Patent Application No. 2000-00940, filed on Jan. 10, 2000, the contents of which are herein incorporated by reference in their entirety.

FIELD OF THE INVENTION

The present invention relates to a semiconductor memory device, and more particularly to an arrangement of input/output lines and a circuit associated with sense amplifiers in a semiconductor memory device.

BACKGROUND OF THE INVENTION

A general arrangement of a semiconductor memory device, as shown in FIG. 1, includes a divided array of memory banks and a peripheral circuit. Assuming that the semiconductor memory device formed on semiconductor chip 1 has a storage capacity of 128 Mb, four banks BANK1~BANK4 each has a capacity of 32 Mb. The peripheral circuit disposed between the memory banks at the vertical center of the chip 1 includes circuits for decoding, buffering, and data input/output.

In constructing a 32 MB memory bank, as shown in FIG. 2, a row decoder 20 and column decoder 30 are positioned on the sides of the memory bank. 8K (K is 210) wordlines (IWL) and 4K bitline (BL) pairs are arranged in a matrix form. The memory array of 32 Mb in the memory bank is divided into sixteen memory blocks 40 (designated also MB0~MB15) along a row direction. Each of these memory blocks has a storage capacity of 2 Mb with 512 wordlines and 4K bitlines. 1K (1024) column selection lines CSL0~CSL1023 extending from the column decoder 30 are arranged on and over the memory array, with each column selection line corresponding to four bitlines.

For a given cycle, two wordlines for each memory bank are activated. For example, the row decoder 20 selects one memory block (e.g., MB1) among the memory blocks MB0~MB7 and one memory block (e.g., MB9) among the memory blocks MB8~MB15, and then selects one wordline in each of the selected memory blocks MB1 and MB9. Namely, two wordlines (WL) are selected when one memory bank is selected, and other memory blocks in the selected memory bank are non-selected.

FIG. 3 shows the section A in dashed outline of FIG. 2, including the upper half of memory block MB1 and surrounding circuitry. Between adjacent memory blocks, a sense amplifier block is positioned. For instance, sense amplifier blocks SABLK0 and SABLK1 are interposed between the memory blocks MB0 and MB1, and between the memory blocks MB1 and MB2, respectively. The sense amplifier block comprises bitline isolation regions 50 and 60, bitline precharging/equalizing region 70, P-channel sense amplifier region 80, N-channel sense amplifier region 90, and input/output gating region 100 (in dashed outline). See U.S. Pat. No. 5,761,123 entitled SENSE AMPLIFIER CIRCUIT OF A NONVOLATILE SEMICONDUCTOR MEMORY DEVICE, relevant to circuit elements provided to the bitline isolation regions, the precharging/equalizing region, and the sense amplifier regions.

In the input/output gating region 100, four complementary pairs of input/output lines, IOi, /IOi, IOj, /IOj, IOk, /IOk, IOl, and /IOl, are arranged perpendicular to the bitlines, and column selection gates GT are connected between bitline pairs and input/output line pairs. When a row of the memory block MB1 is selected by the row decoder 20 and a column selection line (e.g., CSL0) is selected by the column decoder 30, bitline pair BL0 and /BL0 is connected to the input/output line pair IOi and /IOi located on the left side of MB1, through the corresponding column selection gate pair whose gates are coupled to CSL0. Also, BL2 and /BL2 are connected to IOj and /IOj arranged at the left side of MB1, through their corresponding column selection gates whose gates are also coupled to CSL0.

At the same time, BL1 and /BL1 are connected to IOi and /IOi arranged at the right side of MB1, and BL3 and /BL3 are connected to IOj and /IOj arranged at the right side of MB1, through their corresponding column selection gates whose gates are coupled to CSL0. Thus, one of the column selection lines can connect four bitline pairs to four input/output line pairs alternately arranged on the either side of the memory block MB1. Since two wordlines (WL signals corresponding to MB1, MB9) are activated upon the selection of one memory bank, data of four bits for each wordline are transferred to four corresponding input/output line pairs. As a result, eight bits are normally read out from one selected memory bank, in keeping with an 8-bit data structure.

If two column selection lines (e.g., CSL0 and CSL512) are selected at the same time, 8-bit data are read out from the selected memory block MB1 by the sense amplifier block corresponding thereto. In more detail, when CSL0 is selected, four bitline pairs BL0, /BL0, BL1, /BL1, BL2, /BL2, BL3, and /BL3 are connected to their corresponding input/output lines IOi, /IOi, IOj, and /IOj. In the same manner, the bitline pairs of BL2048 and /BL2048, and of BL2050 and /BL2050, are connected to the input/output line pairs of IOk and /IOk, and of IOl and /IOl, respectively, the input/output line pairs being arranged at the left side of MB1, through their corresponding column selection gate GT whose gates are coupled to CSL512. And the bitline pairs of BL2049 and /BL2049, and of BL2051 and /BL2051, are connected to the input/output line pairs of IOk and /IOk, and of IOl and /IOl, respectively, the input/output line pairs being arranged at the right side of MB1, through their corresponding column selection gate GT whose gates are coupled to CSL512.

Therefore, it can be seen from FIG. 3 that eight bitline pairs are each connected to eight input/output line pairs alternately arranged on either side of the selected memory block MB1 when two column selection lines (e.g., CSL0 and CSL512) are activated at the same time. Since two wordlines are selected in a given memory bank, activation of two column selection signals enables 16-bit data to be read out of the selected memory banks.

It is possible to alternate between the 8-bit and 16-bit data read-out pattern in the array architecture shown in FIG. 3. It is also possible to construct a 4-bit data structure by multiplexing the input/output line pairs with additional column address bits. Other bitlines and selection gates involved in the activation of other column selection lines are operationally arranged in the same configuration as described above. FIG. 4 shows a layout pattern of the circuit arrangement of FIG. 3, wherein plural gate lines 102 made of polysilicon layers are formed over plural N+ active regions 101. The plural bitlines and the plural active regions 101 are connected at plural contact regions 11, and the active regions and input/output lines made of a metal or conductive material are connected at plural contact regions 13.

The width of the input/output gating region, L, is determined by an integration density dependent upon the number of input/output lines disposed therein. In the gating region interposed between the adjacent memory blocks, eight input/output lines are arranged to provide an efficient data access operation, alternately positioned on either side of a memory block. However, a chip size of a memory device becomes even smaller as the size of electronic apparatus employing the memory device becomes smaller. The density of a memory device, which must is increase, is greatly influenced by repetitive patterns of the signal lines such as bitlines and input/output lines. As may be seen from FIG. 4, the regular horizontal arrangement of the eight input/output lines within a given sense amplifier block leaves inoperable regions thereof having no contacts to the active regions. This causes the width L to be unnecessarily and undesirably extended. Accordingly, there is a need for a more efficient input/output line arrangement.

SUMMARY OF THE INVENTION

It is therefore an object of the present invention to provide an efficient input/output line arrangement that is advantageous in reducing the size (area) of a semiconductor memory device.

It is another object of the invention to provide an optimized input/output line structure in a semiconductor memory device by reducing the circuit area occupied by a repetitive or otherwise wasteful arrangement of the input/output lines.

In order to attain the above objects, a semiconductor memory device includes a plurality of memory blocks, and a plurality of input/output lines associated with the memory blocks, the input/output lines being divided into at least a first group and a second group. First portions of the input/output lines of the first group are arranged between adjacent memory blocks while first portions of the input/output lines of the second group are arranged in circuit blocks around the adjacent memory blocks, and second portions of the input/output lines of the first group are arranged in circuits blocks around the memory blocks while second portions of the input/output lines of the second group are arranged between the adjacent memory blocks. The present invention will be better understood from the following detailed description of the exemplary embodiment thereof taken in conjunction with the accompanying drawings, and the scope of the invention will be defined by the appended claims.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

The bar "¯" over or prefix "/" attached to referenced signals lines (e.g. bitlines or input/output lines) refers to the logical complement of the corresponding signal line.

DESCRIPTION OF THE PREFERRED EMBODIMENT

It should be understood that the description of this preferred embodiment is merely illustrative and that it should not be taken in a limiting sense. In the following detailed description, several specific details are set forth in order to provide a thorough understanding of the present invention. It will be obvious, however, to one skilled in the art that the present invention may be practiced without these specific details.

Figure 1:
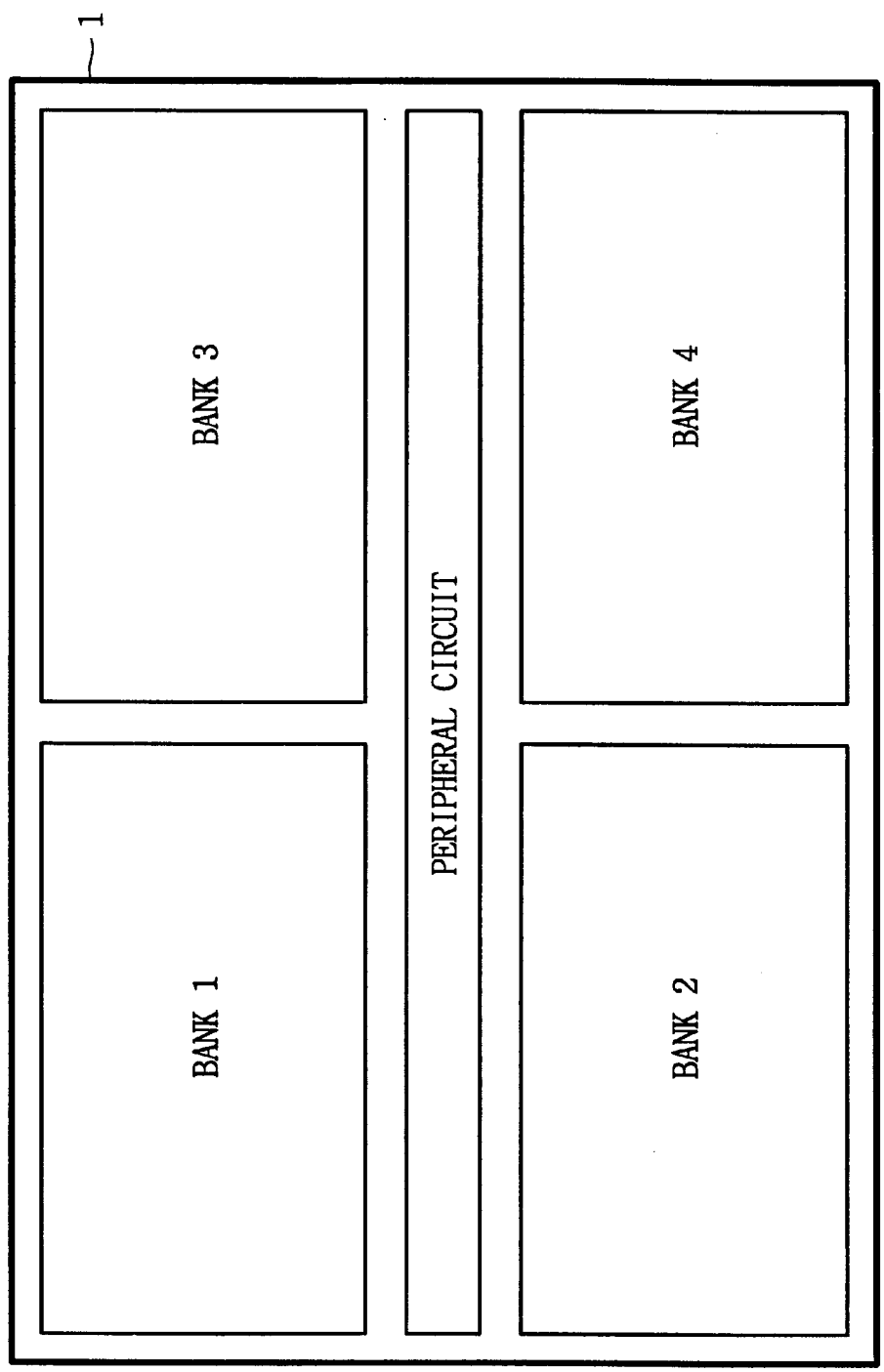
FIG. 1 is a schematic view of a general arrangement in a conventional, i.e. prior art, semiconductor memory device.
Figure 2:
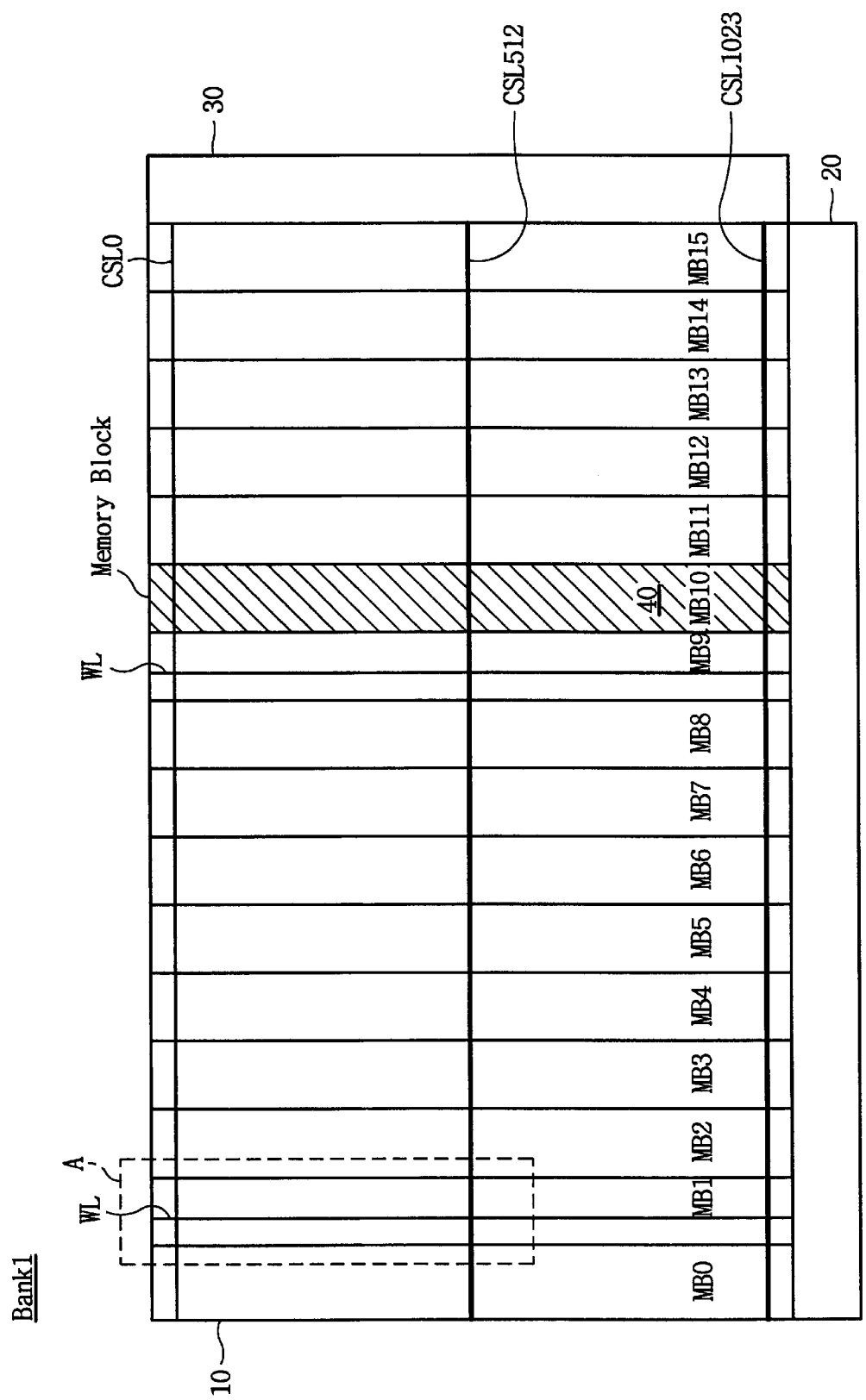
FIG. 2 is a schematic view of a detail inter-arrangement within a memory bank of the conventional device shown in FIG. 1.
Figure 3:
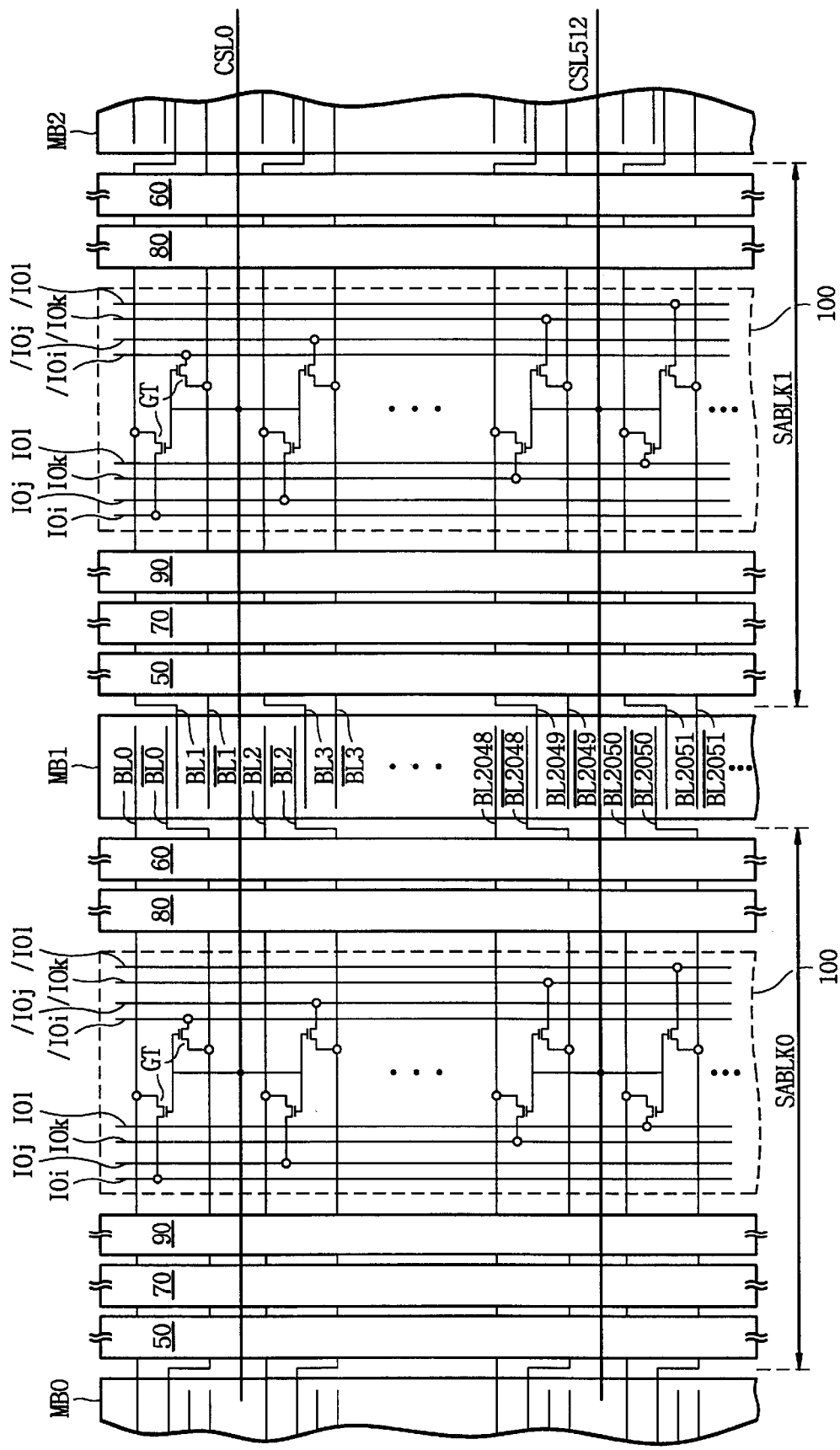
FIG. 3 is an internal circuit view of the outlined part of FIG. 2, disclosing a conventional construction of an input/output gating region.
Figure 5:
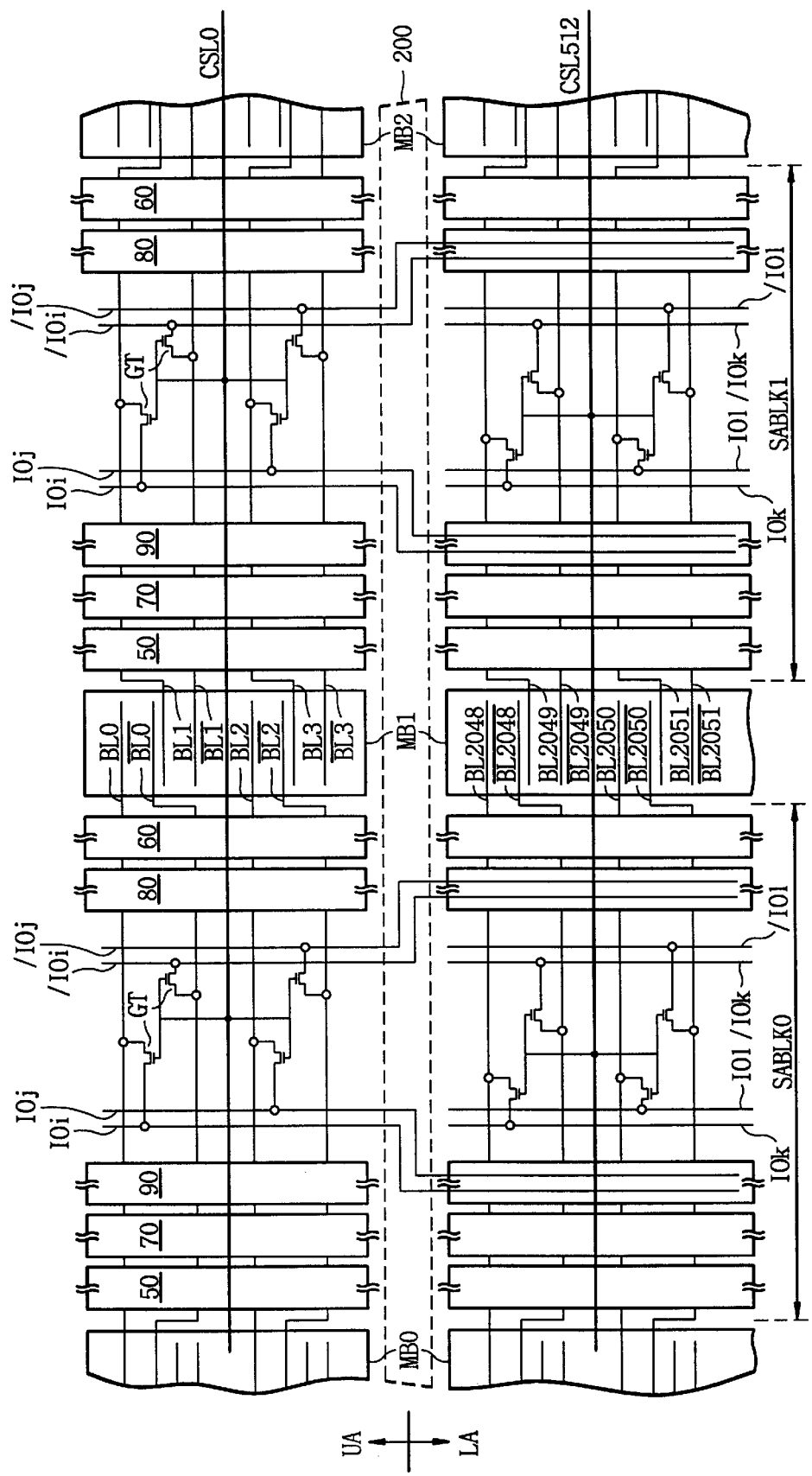
FIG. 5 is an internal circuit view of the outlined part of FIG. 2, but disclosing a unique arrangement of an input/output gating region according to the present invention.

The embodiment of the invention is applied to a high density dynamic random access memory (DRAM) and is useful for date structures of suitable bit width, e.g. 16-bit, 8-bit, etc. FIG. 5 shows an arrangement with input/output lines between memory blocks, including the bitline isolation blocks 50 and 60, the bitline precharging/equalizing blocks 70, and the sense amplifier blocks 80 and 90. Contrasting FIG. 5 and FIG. 3, those of skill in the art will appreciate that the invention involves symmetrically dividing the left and right sides of a memory block (e.g., MB1) as in the prior art and dividing upper and lower arrays, and interface region 200 so that the blocks 60 through 90, and the memory blocks, e.g. MB0, MB1, MB2, etc., into two portions (upper and lower portions).

The input/output (I/O) lines are allocated in the gating region between the sense amplifier blocks 80 and 90, in dual pairs. The i'th I/O line pair including IOi and /IOi, and the j'th I/O line pair of IOj and /IOj, collectively referred to herein as "the first input/output line group", are disposed between the upper sense amplifier blocks associated with the adjacent the upper memory blocks, and within the lower sense amplifier blocks associated with the lower memory blocks. In the upper array UA, gates of four of the column selection transistors GT connected to the i'th and j'th P/O line pairs are coupled in common to CSL0 so as to connect the i'th and j'th I/O line pairs to bitline pairs BL0 and /BL0 through BL2047 and /BL2047 (not shown for the sake of clarity). Each column selection transistor GT connects one I/O line to a corresponding bitline. The upper array UA is assigned to 512 column selection lines CSL0~CSL511 (only CSL0 of which is shown for clarity).

On the contrary, in the lower array LA, the k'th I/O line pair IOk and /IOk and the l'th I/O line pair IOl and /IOl, collectively referred to herein as "the second input/output line group", all are disposed between the lower sense amplifier blocks associated with the adjacent lower memory blocks. The interconnection manner with the column selection lines and transistors GT is identical to that in the upper array LA, connecting the k'th and l'th I/O line pairs to bitline pairs BL2048 and /BL2048 through BL4095 and /BL4095 (not shown for the sake of clarity). The lower array LA includes also 512 column selection lines CSL512~CSL1023. (only CSL512 of which is shown for clarity).

Figure 4:
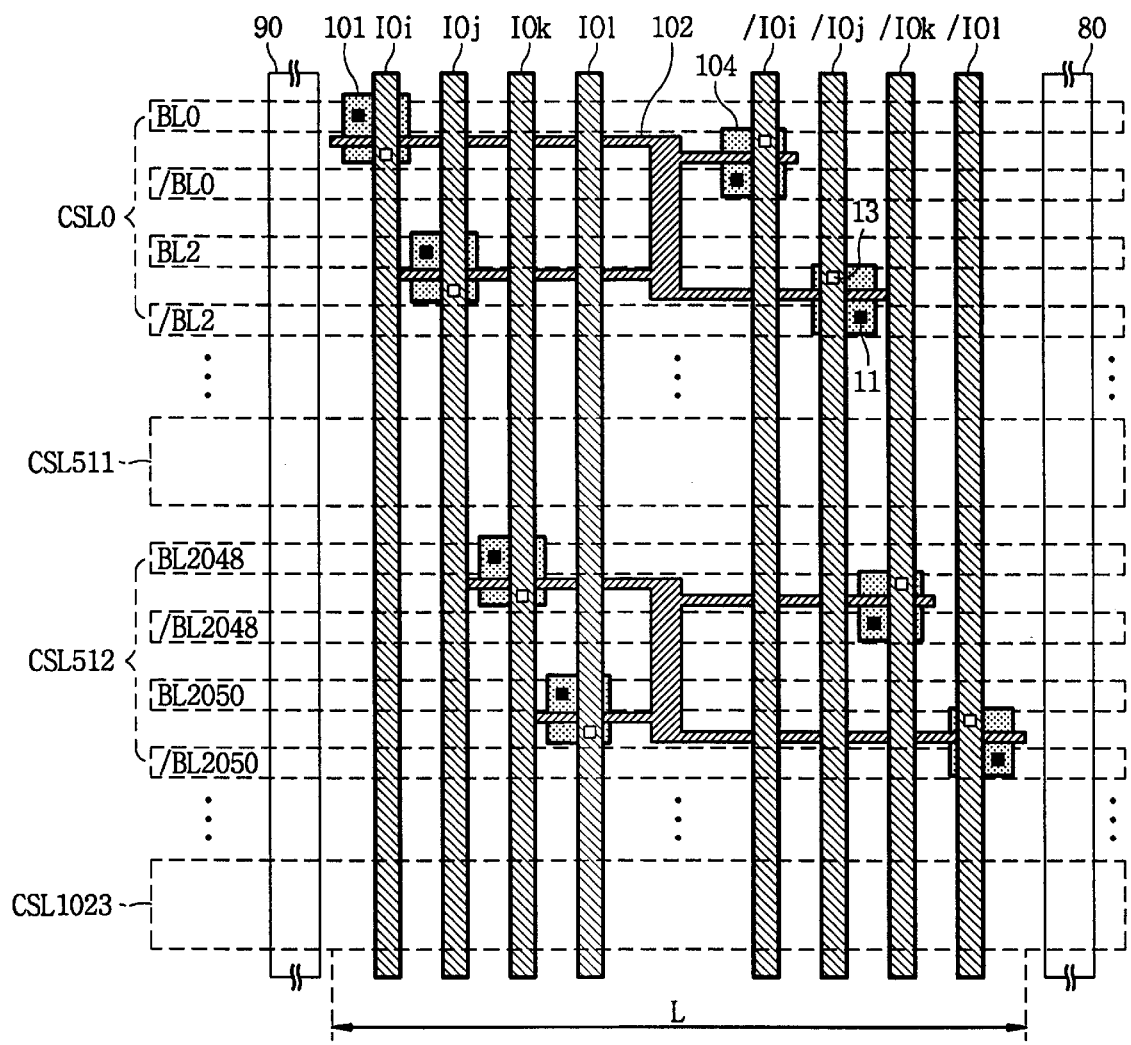
FIG. 4 is a top view showing a layout pattern over the input/output gating region of FIG. 3.

The first and second input/output line groups are aligned to extend along the same column axis to obviate a need for more lateral space along a row direction. This arrangement reduces the width (see FIG. 4) of the I/O gating region, e.g. by a factor of approximately two.

When a wordline WL in a memory block (e.g. MB1) and a column selection line (e.g., CSL0) are selected, the first bitline pair BL0 and /BL0 is connected to an I/O line pair IOi and /IOi arranged at the left side of the selected memory block, e.g. MB1, through its column selection transistors GT. The third bitline pair BL2 and /BL2 is connected to the I/O line pair IOj arranged at the left side of the selected memory block, e.g. MB1, through its corresponding column selection transistors GT. The second bitline pair BL1 and /BL1a is connected to IOi and /IOi arranged at the right side of the selected memory block, e.g. MB1. The fourth bit line pair BL3 and /BL3 is connected to I/O line pair IOj and /IOj arranged at the right side of the selected memory block, e.g. MB1.

Thus, one column selection line connects four pairs of bitlines to four pairs of I/O lines alternately arranged at either side of the selected memory block, e.g. MB1. As two wordlines WL each for two memory blocks are activated in one memory bank (one wordline WL per memory block), 4-bit date are transferred to the four I/O line pairs arranged at either side of each of the two memory blocks. Thus, 80-bit data is read out from a selected memory bank and the memory device is operative in an 8-bit data structure.

When two column selection lines (e.g., CSL0 and CSL512 are simultaneously activated, 8-bit data are read from the selected memory block, e.g. MB1, by means of the corresponding sense amplifier blocks. Responding to an activation of CSL0, four pairs of bitlines, BL0, and /BL0, BL1 and /BL1, BL2 and /BL2, and BL3 and /BL3, are connected to their corresponding I/O line pairs, IOi and /IOi, IOj and /IOj, IOk and /IOk, and /IOl, alternately arranged at either side of MB1, through the column selection transistors GT whose gates are coupled to CSL0. Responding to an activation of CSL512, four pairs of bitlines, BL2048 and /BL2048, BL2049 and /BL2049, BL2050 and /BL2050, and BL2051 and /BL2051, are connected to their corresponding I/O line pairs, IOi and /IOi, IOj and /IOj, IOk and /IOk, IOl and /IOl, alternately arranged at either side of MB1, through the column selection transistors GT whose gates are vouples to CSL512. As 8-bit data are read from one memory block and two wordlines WL per memory bank are activated, 16-bit data are read from the selected memory blocks (e.g., MB1 and MB9) and the memory device is operative in a 16-bit data structure.

Figure 6A:
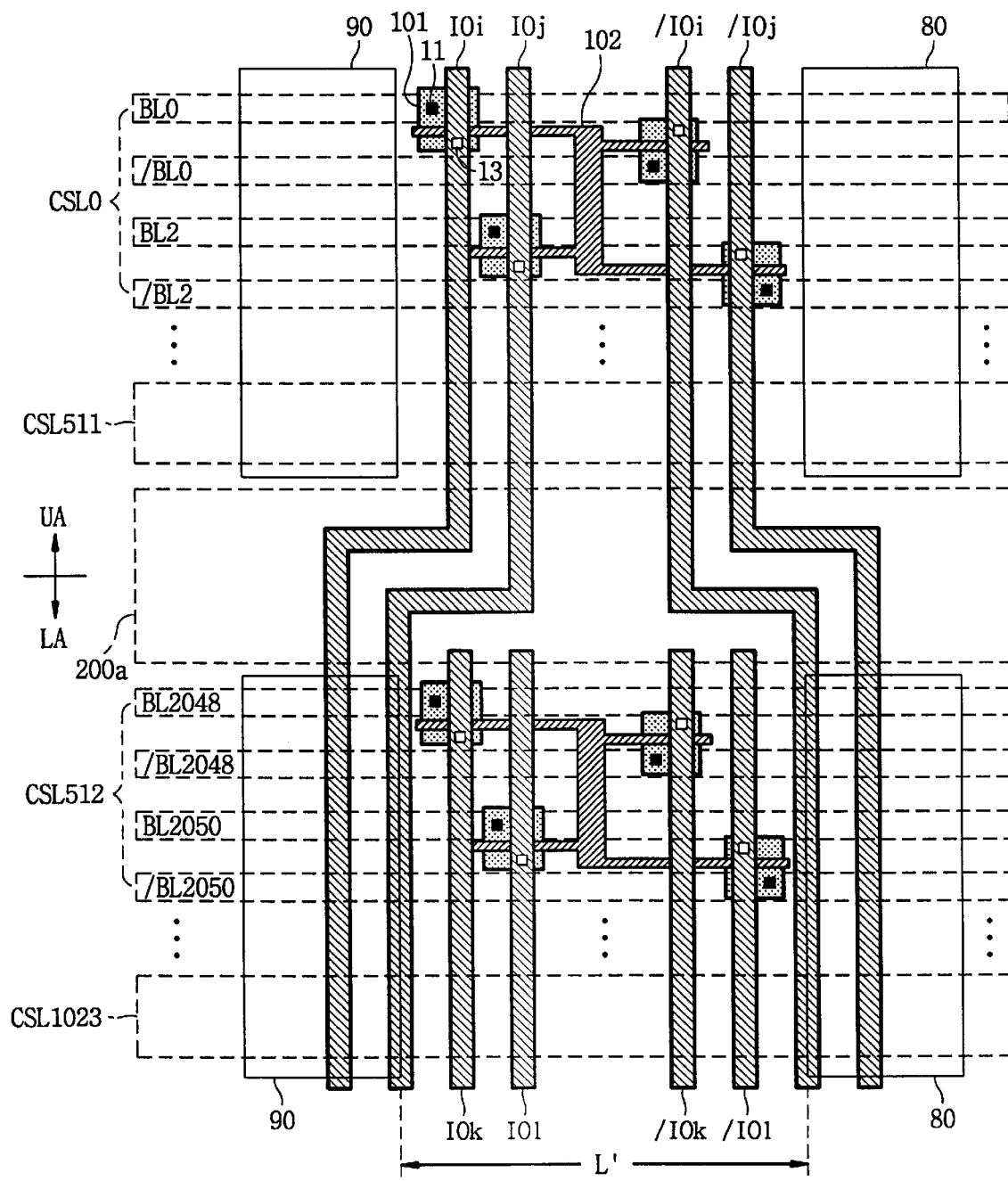
FIGS. 6A through 6C are top views showing embodied layout patterns over the input/output gating region of FIG. 5.
Figure 6B:
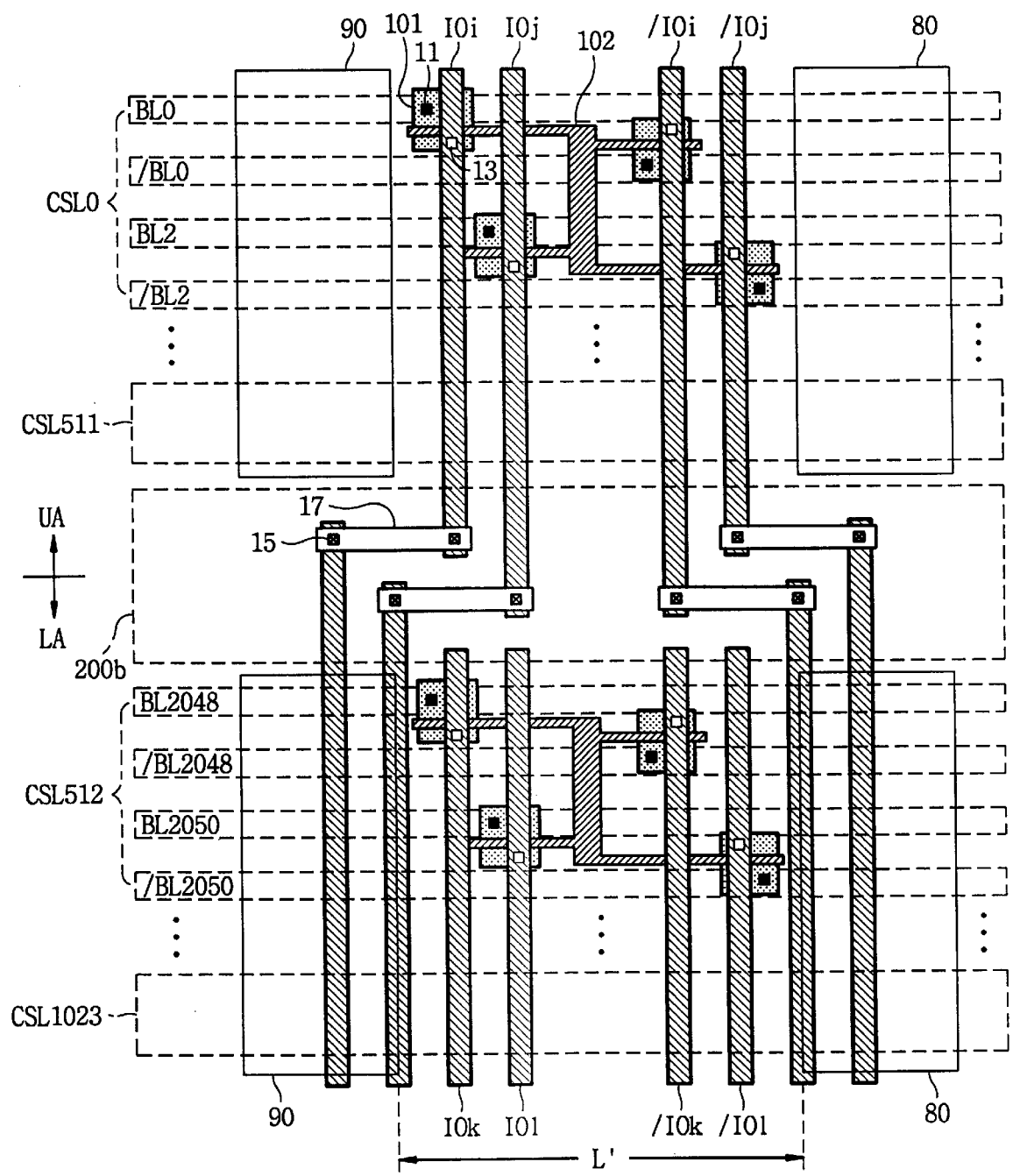
Figure 6C:
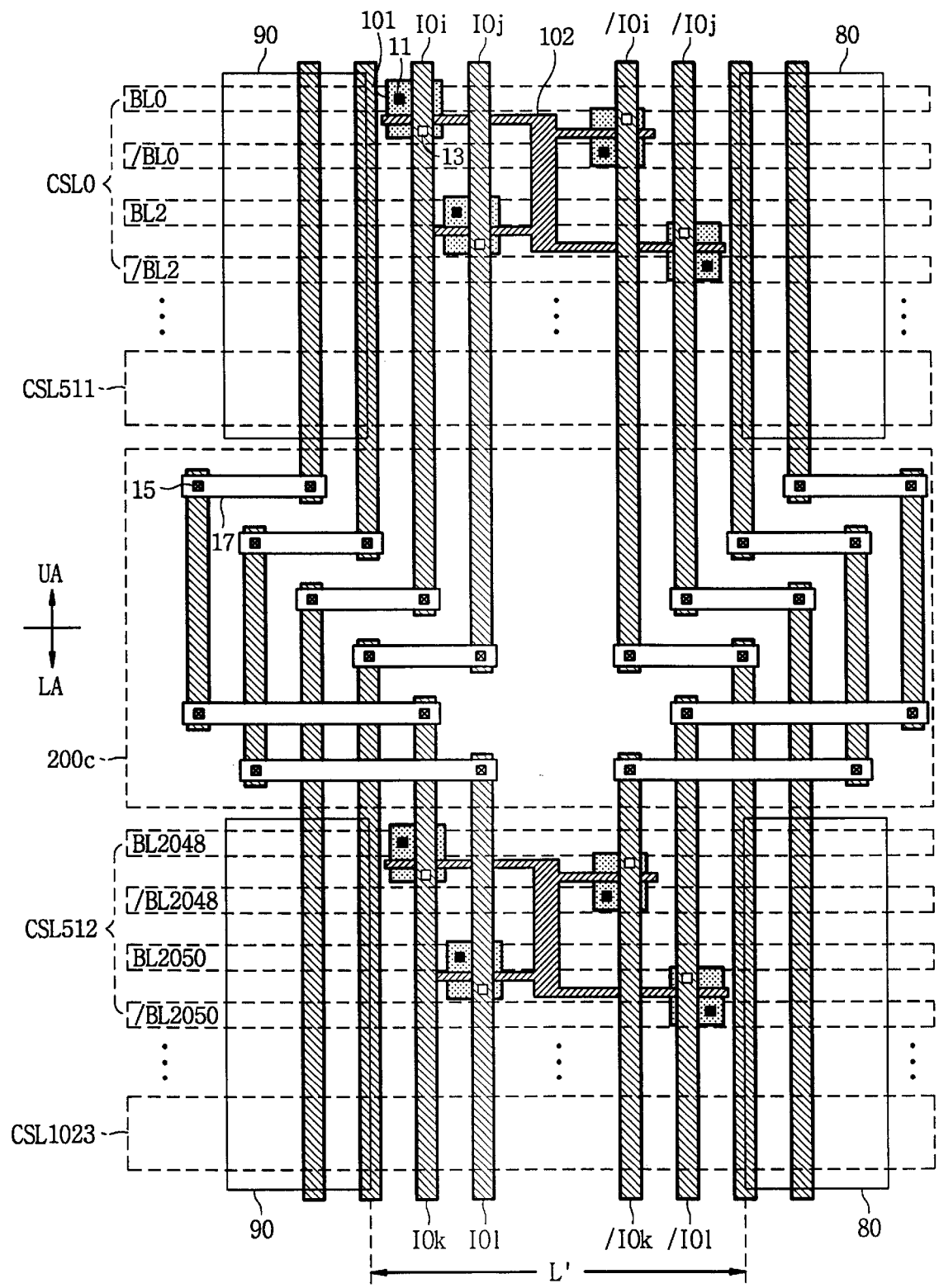

FIGS. 6A through 6C show available layout patterns according to the arrangement with the I/O lines, which reduces the width L (refer to FIG. 4) I/O gating region. The I/O lines are made of the first metal layers. Throughout FIGS. 6A through 6C, the first I/O line group of IOi and /IOi, IOj and /IOj is disposed between the sense amplifier blocks 80 and 90 in the upper array UA, while the group is arranged within the sense amplifier blocks 80 and 90 in the lower array LA. The second input/output line group of IOk and /IOk, IOl and /IOl is disposed only between the sense amplifier blocks 80 and 90 in the lower array LA. It can be understood, from FIG. 6A that the other part of the second input/output group (not shown) is arranged within the sense amplifier blocks 80 and 90 in the next-lower array as is the first group in the lower array LA (shown). Thus, the width of the input/output gating region, L, is substantially reduced compared to the conventional one L shown in FIG. 4. It can be seen that the width of the group area L' may be approximately half of the width of the conventional arrangement.

While the interface region 200a in FIG. 6A acts as boundary defining the upper and lower arrays, or a passage zone where the input/output lines change their arrangement features, the interface regions 200b and 200c each in FIGS. 6B and 6C provide a space for connecting the input/output lines separately arranged in the upper and lower arrays. Each of the input/output lines, Ioi /IOl, is interconnected therebetween the interface region 200 through the contact regions 15 and the second metal layers 17.

That is, referring to FIG. 6B, a part of IOi arranged between the sense amplifier blocks 80 and 90 in the upper array UA is connected to the other part of IOi arranged on the sense amplifier block 90 in the lower array LA. A part of IOj arranged between the sense amplifier blocks 80 and 90 in the upper array UA is connected to the other part of IOj arranged on the sense amplifier block 90 in the lower array LA. A part of /IOi arranged between the sense amplifier blocks 80 and 90 in the upper array UA is connected to the other part of /IOi arranged within the sense amplifier block 80 in the lower array LA. A part of IOj arranged between the sense amplifier blocks 80 and 90 in the upper array UA is connected to the other part of /IOj arranged within the sense amplifier block 80 in the lower array LA.

In FIG. 6C, an entire alternation with the first and second input/output line groups is disclosed between the upper and lower arrays, including interface region 200c where the self-interconnections of the input/output lines themselves are made by the contact regions 15 and the second metal layers 17. A part of IOi arranged between the sense amplifier blocks 80 and 90 in the upper array UA is connected to the other part of IOi arranged on the sense amplifier block 90 in the lower array LA. A part of IOj arranged between the sense amplifier blocks 80 and 90 in the upper array UA is connected to the other part of IOj arranged within the sense amplifier block 90 in the lower array LA. A part of /IOi arranged between the sense amplifier blocks 80 and 90 in the upper array UA is connected to the other part of /IOi arranged within the sense amplifier block 80 in the lower array LA. A part of /IOj arranged between the sense amplifier blocks 80 and 90 in the upper array UA is connected to the other part of /IOj arranged within the sense amplifier block 80 in the lower array LA.

A part of IOk arranged between the sense amplifier blocks 80 and 90 in the lower array LA is connected to the other part of IOk arranged within the sense amplifier block 90 in the upper array UA. A part of IOl arranged between the sense amplifier blocks 80 and 90 in the lower array LA is connected to the other part of IOl arranged within the sense amplifier block 90 in the upper array UA. A part of /IOk arranged between the sense amplifier blocks 80 and 90 in the lower array LA is connected to the other part of /IOk arranged within the sense amplifier block 80 in the upper array UA. A part of /IOl arranged between the sense amplifier blocks 80 and 90 in the lower array LA is connected to the other part of /IOl arranged within the sense amplifier block 80 in the upper array UA. Different from the interconnection features of the first group, the second group utilizes additional layers of the first metal to connect their upper and lower parts. Such additional metal layers in the interface region 200c are optional components to adaptively adjust the arrangement topology in the gating region.

As described above, the width L of the input/output gating region where repetitive patterns of input/output lines cause the layout density maybe substantially reduced approximately half compared to the conventional art. Accordingly, layout margin is greater and overall chip size is smaller than before.

Although the preferred embodiments of the present invention have been disclosed for illustrative purposes, those skilled in the art will appreciate that various modifications, additions and substitutions are possible, without departing from the scope and spirit of the invention as described in the accompanying claims. Although, in the embodiment, the parts of the input/output lines are arranged within the sense amplifier blocks, it would be understood by those skilled in the art that it is possible to arrange the parts in other available regions around their corresponding memory blocks.

What is claimed is:

1. A semiconductor memory device, comprising:

a plurality of memory blocks having associated with one or more circuit blocks therearound;

a plurality of input/output lines associated with the memory blocks;

wherein the input/output lines are divided into at least a first group and a second group;

wherein first portions of the input/output lines of the first group are arranged between adjacent ones of the memory blocks while first portions of the input/output lines of the second group are arranged within the circuit blocks around the adjacent memory blocks, and second portions of the input/output lines of the first group are arranged within the circuit blocks around the memory blocks while second portions of the input/output lines of the second group are arranged between the adjacent memory blocks.

2. A semiconductor memory device, comprising:

a plurality of memory blocks;

a sense amplifier block associated with the memory blocks, the sense amplifier block disposed between the memory blocks; and a plurality of input/output lines electrically connected to the memory blocks;

wherein the input/output lines comprises a first group and a second group, the first group including a first portion and a second portion;

wherein the first portion of the first group is arranged between the adjacent memory blocks and the second portion of the first group is arranged over a portion of the sense amplifier block.

3. The semiconductor memory device of claim 2, wherein the second group includes a first portion and a second portion, and the first portion of the second group is arranged between the adjacent memory blocks and the second portion of the second group is arranged over a portion of the sense amplifier block.

* * * * *